(12) United States Patent
Pramanick et al.

(10) Patent No.: US 8,214,800 B2
(45) Date of Patent: Jul. 3, 2012

(54) COMPACT REPRESENTATION OF VENDOR HARDWARE MODULE REVISIONS IN AN OPEN ARCHITECTURE TEST SYSTEM

(75) Inventors: Ankan Pramanick, San Jose, CA (US);
Mark Elston, Salinas, CA (US);
Toshiaki Adachi, San Jose, CA (US)

(73) Assignee: Advantest Corporation, Tokyo (JP)

( * ) Notice: Subject to any disclaimer, the term of this patent is extended or adjusted under 35 U.S.C. 154(b) by 1681 days.

(21) Appl. No.: 11/070,957

(22) Filed: Mar. 2, 2005

(65) Prior Publication Data

US 2006/0200816 A1    Sep. 7, 2006

(51) Int. Cl.
*G06F 9/44* (2006.01)
(52) U.S. Cl. .................. 717/120; 717/124; 717/170
(58) Field of Classification Search .............. 717/100, 717/120–135, 170
See application file for complete search history.

(56) References Cited

U.S. PATENT DOCUMENTS

| | | | | |
|---|---|---|---|---|
| 5,892,949 | A * | 4/1999 | Noble | 717/125 |
| 6,182,275 | B1 * | 1/2001 | Beelitz et al. | 717/175 |
| 6,868,513 | B1 * | 3/2005 | Botala et al. | 714/738 |
| 2003/0037174 | A1 * | 2/2003 | Lavin et al. | 709/313 |
| 2003/0115367 | A1 * | 6/2003 | Ohara | 709/249 |
| 2003/0140134 | A1 * | 7/2003 | Swanson et al. | 709/223 |
| 2004/0225459 | A1 | 11/2004 | Krishnaswamy et al. | |
| 2004/0225465 | A1 * | 11/2004 | Pramanick et al. | 702/119 |
| 2005/0022087 | A1 * | 1/2005 | Pramanick et al. | 714/742 |
| 2005/0125512 | A1 * | 6/2005 | Fuller et al. | 709/220 |
| 2005/0154551 | A1 * | 7/2005 | Pramanick et al. | 702/119 |
| 2005/0262412 | A1 | 11/2005 | Mukai et al. | |

FOREIGN PATENT DOCUMENTS

| | | |
|---|---|---|
| EP | 1 237 073 A2 | 9/2002 |
| EP | 1 237 073 A3 | 9/2002 |

OTHER PUBLICATIONS

Drew Heywood, "Drew Heywood's Windows 2000 Network Services", Sams, Feb. 2001.*
"Microsoft Windows Server 2003: Automating and Customizing Installations", Microsoft Press, Jun. 2003.*
Rajsuman et al., "Open Architecture Test System: System Architecture and Design," 2004, IEEE, p. 403-412.*
Rajsuman, Rochit, "An Overview of the Open Architecture Test System," Jan. 2004, IEEE, p. 1-6.*
Rajsuman, Rochit, "New Opportunities with the Open Architecture Test System," Jan. 2004, IEEE, p. 335.*
Parnas et al., "Software Development for an Open Architecture Test System," May 2004, IEEE.*

(Continued)

*Primary Examiner* — Wei Zhen
*Assistant Examiner* — Qing Chen
(74) *Attorney, Agent, or Firm* — Morrison & Foerster LLP (57) ABSTRACT

Method and system for associating software components with vendor hardware module versions in an open architecture test system are disclosed. The method includes receiving a set of hardware versions of a vendor hardware module, receiving a set of software components supported by the vendor hardware module, processing the set of hardware versions, where the set of hardware versions is represented as an equivalence class of hardware version numbers using a mask value, obtaining user choices of hardware versions of the vendor hardware module, validating the user choices of hardware versions of the vendor hardware module, and creating a system profile in accordance with the user choices of hardware versions.

21 Claims, 5 Drawing Sheets

OTHER PUBLICATIONS

International Search Report mailed on Jul. 6, 2006 for PCT Application No. PCT/JP2006/304517 filed on Mar. 2, 2006, three pages.
Pramanick, A. et al. (Oct. 2004). "Test Programming Environment in a Modular, Open Architecture Test System," *IEEE* at ITC International Test Conference: Charlotte, NC, Oct. 26-28, 2004, Paper 14.2, pp. 413-422.
Notice of Reasons for Refusal mailed Mar. 13, 2012, for JP Patent Application No. 2007-540439, with English Translation, 10 pages.

* cited by examiner

COMPACT REPRESENTATION OF VENDOR HARDWARE MODULE REVISIONS IN AN OPEN ARCHITECTURE TEST SYSTEM

FIELD OF THE INVENTION

The present invention relates to the field of automated test equipment (ATE) for semiconductor testing. In particular, the present invention relates to a compact representation of vendor hardware module versions in an open architecture test system for efficient field deployment.

BACKGROUND OF THE INVENTION

In an open architecture test system, software needs to have access to vendor specifications for the list of vendor hardware module versions that are guaranteed to work with each version of the accompanying module software, for every vendor hardware module with which the user's particular system is configured, and for every different associated module software component for each such vendor hardware module. The system is then required to analyze this complex information efficiently to determine the choices for software components it should present to the user as candidates for the software content of the system.

Ideally, the presented choices for software components should comprise as large a set as possible, within the overall constraint that any complete set of software components the user picks from the given choices are guaranteed to work together, and work with the user's chosen hardware configuration. In the context of this problem, one method is to list compatible hardware versions for each software component, such as a comma-separated list of integral numbers, to represent the hardware version numbers (with range specifiers for denoting contiguous numbers). This method has a number of problems.

First, hardware version numbers are often large; requiring as many as 32 bits, where different bit-fields within the numbers may have different proprietary significance to the hardware vendor. If the vendor chooses to certify all versions with all possible values for a particular pattern of bits within the number as being compatible with a single software version, this may lead to: a) a non-contiguous sequence of version numbers, which cannot be efficiently represented through range specifiers; and/or b) a very large number of version numbers, yielding a very long list, which may be quite impractical for storage and/or processing purposes. Second, the method is quite restrictive, especially in the case of very frequent hardware product updates, which may call for frequent additions to the list, and consequently, a tedious and frequent process of regeneration of system profiles at a user's site to incorporate the additions. Therefore, there is a need for a compact representation of vendor hardware module versions in an open architecture test system for efficient field deployment.

SUMMARY

A method is disclosed such that a hardware module vendor can specify, in a compact manner, an arbitrary sequence of hardware version numbers that are guaranteed to work with a given version of the associated module software in an open architecture test system. In addition, the hardware version numbers are processed so as to provide the user with an optimal set of software component choices for the vendor hardware modules, which lead to a valid system configuration for deployment in the field.

In one embodiment, a method for associating software components with vendor hardware module versions in an open architecture test system includes receiving a set of hardware versions of a vendor hardware module, receiving a set of software components supported by the vendor hardware module, processing the set of hardware versions, where the set of hardware versions is represented as an equivalence class of hardware version numbers using a mask value, obtaining user choices of hardware versions of the vendor hardware module, validating the user choices of hardware versions of the vendor hardware module, and creating a system profile in accordance with the user choices of hardware versions.

In another embodiment, an open architecture test system includes a System Controller, a Site Controller coupled to the System Controller, one or more hardware modules coupled to the Site Controller, and one or more devices-under-test (DUTs) serviced in parallel by groups of the hardware modules. The system further includes means for receiving a set of hardware versions of a vendor hardware module, means for receiving a set of software components supported by the vendor hardware module, means for processing the set of hardware versions, where the set of hardware versions is represented as an equivalence class of hardware version numbers using a mask value, means for obtaining user choices of hardware versions of the vendor hardware module, means for validating the user choices of hardware versions of the vendor hardware module, and means for creating a system profile in accordance with the user choices of hardware versions.

In yet another embodiment, a method for representing vendor hardware module versions in an open architecture test system includes receiving a set of hardware versions of a vendor hardware module and representing the set of hardware versions as an equivalence class of hardware version numbers using a mask value including a mask number and a mask. The mask is a data pattern within the range of the set of hardware versions and the data pattern includes at least a don't-care bit and a unmask bit.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

DESCRIPTION OF EMBODIMENTS

Methods and systems are provided for a compact representation of vendor hardware module versions in an open architecture test system. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Figure 1A:
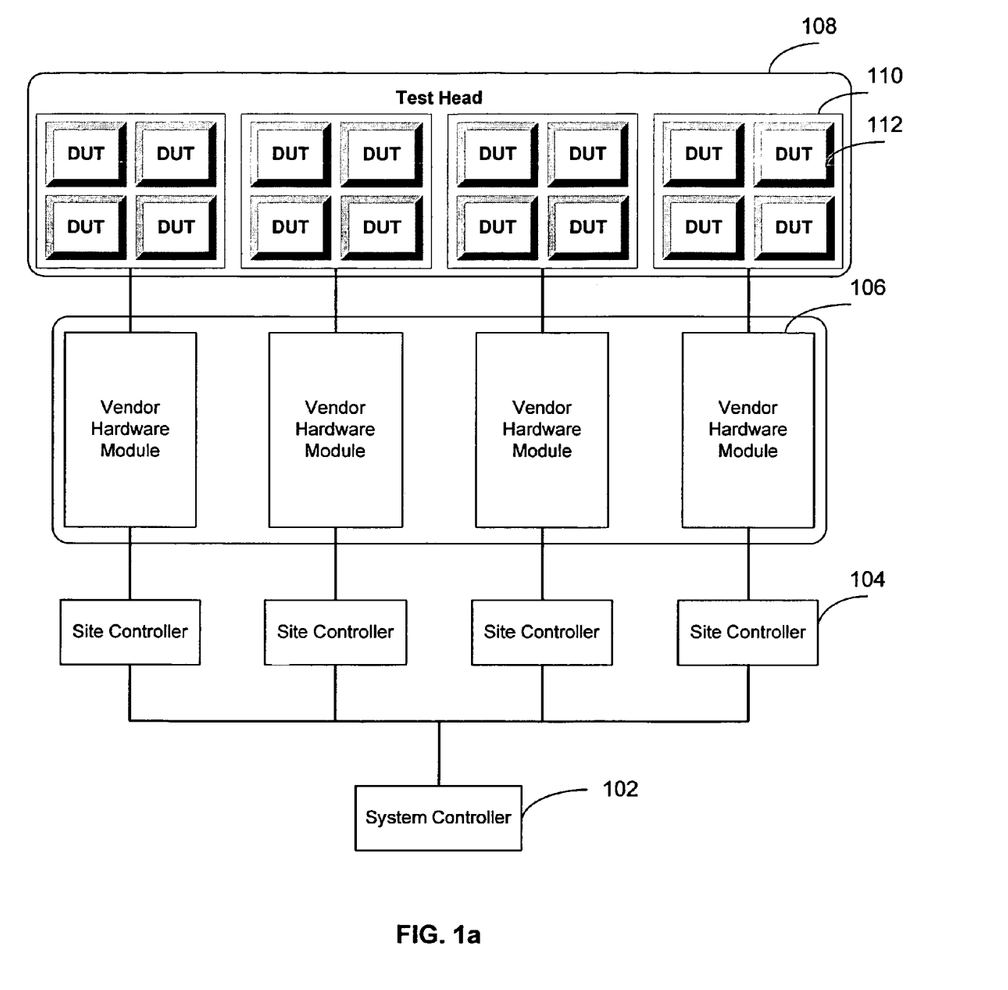
FIG. 1a illustrates an open architecture test system for parallel testing of multiple DUTs with one or more SiteCs according to an embodiment of the present invention.

A re-configurable open architecture test system provides a solution under which third party software and hardware (also known as vendor hardware modules) can be developed, certified individually, and integrated reliably into the open architecture test system. FIG. 1a illustrates an open architecture test system for parallel testing of multiple DUTs with one or more SiteCs according to an embodiment of the present invention. The system includes a System Controller 102, a plurality of Site Controllers 104, a plurality of vendor hardware modules 106, and the corresponding group of DUTs 110; each group of DUTs may include one or more individual DUTs 112. The test head 108 holds the group of DUTs 110. In one embodiment, the System Controller and the Site Controller(s) may be implemented by a distributed computing system with multiple computers in multiple geographical locations. In another embodiment, the System Controller and the Site Controller may be implemented by a single computer. A detailed description of an open architecture test system is provided by U.S. application No. 60/447,839, "Method and Structure to Develop a Test Program for Semiconductor Integrated Circuits," and by U.S. application No. 60/573,577, "Software Development in an Open Architecture Test System," both of which are incorporated herein in their entirety by reference. In addition, an open architecture test system is also described in "Testing Programming Environment in a Modular Open Architecture Test System," by A. Pramanick et al., in 2004 *IEEE International Test Conference*, October 2004, pp. 413-422, which is incorporated herein in its entirety by reference.

In such an open architecture test system, each modular unit, both software and hardware, is replaceable by third party units, as long as the third party solutions conform to the requirements of the integrating framework. Thus, third party hardware may be any functional unit, such as a digital pin card, an analog card, a device power supply, etc. The term vendor hardware module (or module for short) is used to refer to such a hardware functional unit, while the associated vendor software components in support of the vendor hardware module are referred to as the module software. The latter comprise several distinct software components, such as module control driver software, calibration and diagnostic software, emulation software, vendor-specific pattern compilers, etc.

Figure 1B:
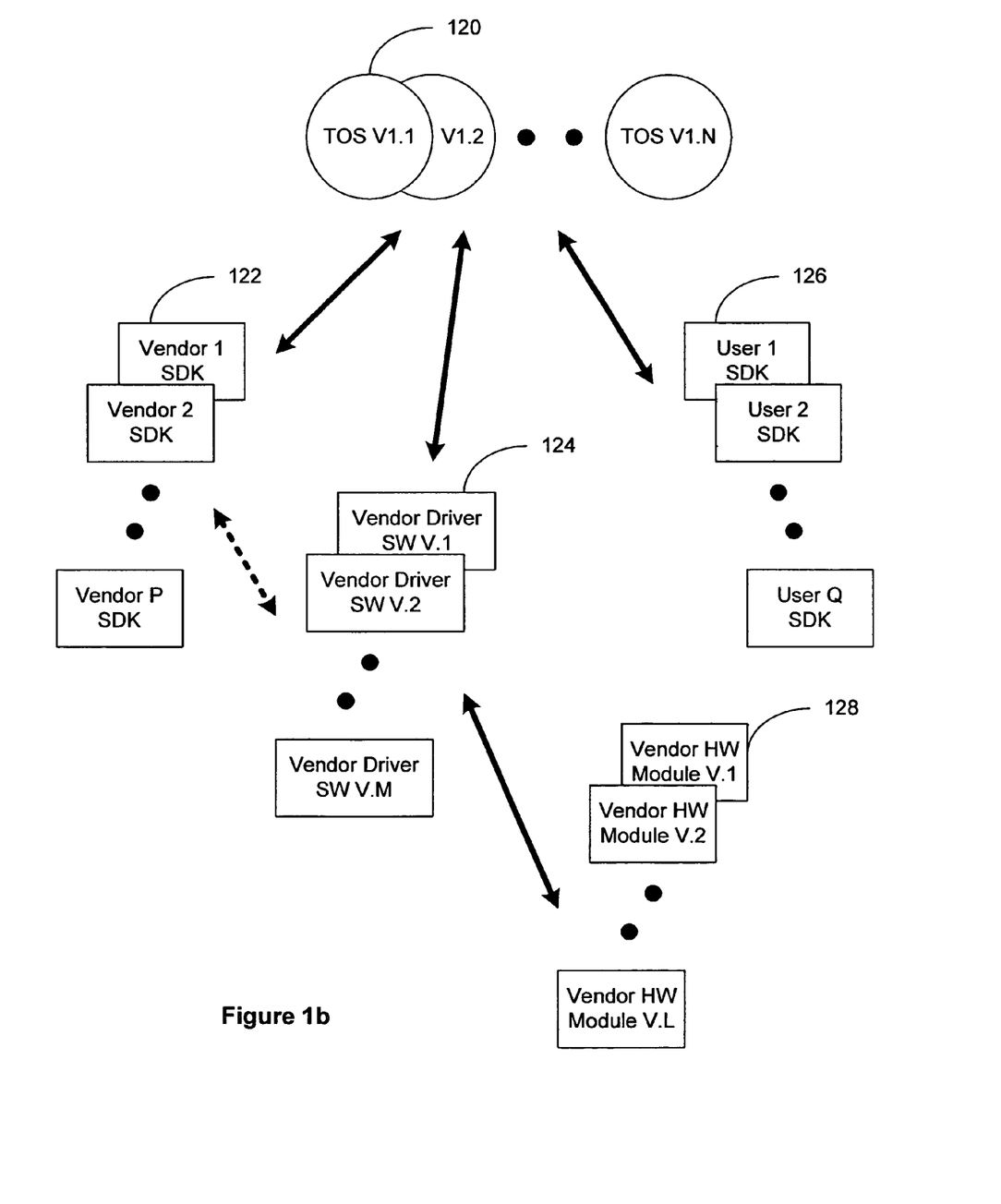
FIG. 1b illustrates an example of multiple vendor hardware module versions and their corresponding software component versions in an open architecture test system.

An open architecture test system provides not only for the operation of the test system, but also for controlling the test environment and introduction of new vendor hardware modules, along with all their accompanying software. FIG. 1b illustrates an example of multiple vendor hardware module versions 128 and their corresponding software component versions in an open architecture test system. The software components include multiple versions of the Tester Operating System (TOS) 120 and its associated versions of Vendor software development kits (SDKs) 122 and User SDKs 126, as well as multiple versions of Vendor software drivers 124. A method for managing multiple vendor hardware module versions and software component versions such as TOSs, Vendor SDKs, and User SDKs, in an open architecture test system is provided by U.S. application No. 60/635,094, "Method and System for Performing Installation and Configuration Management of Tester Instrument Modules," which is assigned to the assignee of the present application, and which is incorporated herein in its entirety by reference.

The test system is required to be flexible enough such that a particular version n of the module software, for a vendor hardware module M, can be verified by the test system as being compatible with a particular system configuration, as long as the vendor of module M has certified that version n of the software is compatible with certain different versions of vendor hardware modules that may co-exist in that given system configuration. The vendor is required to publish a list of hardware versions for module M that are guaranteed to work with the version n of the module software for M.

When a user configures an open architecture test system with particular versions of the vendor hardware modules and their associated module software, it is up to the system software to verify that the user's choice has actually resulted in a working system. For this reason, such an open architecture test system needs to rely on system profile information that is created by the user, with proper guidance from the system to the user during profile creation that constrains the user to make only valid choices for system configuration, both hardware and software, and given that a large system can have scores of different vendor hardware modules, each with multiple associated software components. Thus, the task of providing proper guidance to the user to create a system profile, while at the same time not restricting the user unnecessarily, is very complicated.

In general, the method of providing a compact representation of vendor hardware module versions in an open architecture test system for efficient field deployment includes two main parts: 1) specifying the hardware versions; and 2) processing the hardware versions information and allowing the user to create valid system profiles. A person skill in the art would recognize that the method may be applied to represent software component versions, such as versions of TOSs, Vendor SDKs, and User SDKs, in an open architecture test system.

In one embodiment, compatible hardware version specification is accomplished by masking an arbitrary set of (vendor-specified) bits in the hardware version number. For instance, the syntax of a hardware version number may be represented as follows in a specification file: 1095188784, 0x01403500/0x0ff0ff00, 8800000111, where the numbers "1095188784" and "8800000111" denote non-masked, single hardware versions, while the number "0x01403500/0x0ff0ff00" denotes a masked number, which represents an entire family (class) of equivalent hardware version numbers.

In this example, a masked value is represented in hexadecimal format, in the syntax "n/m", where 'n' represents a masked number, and 'm' represents a mask. The mask m for a masked number n, in the expression "n/m", is defined as a bit-pattern that specifies an equivalence class (EQC) of numbers based on n, denoted "EQC(n/m)", such that 1) for every bit that is a don't-care (represented by a "0" bit in this example) in m, the corresponding bit in n is masked, indicating that all members of the equivalence class can have either a 1 or a 0 in that bit position; and 2) for every bit that is a unmasked bit (represented by a "1" bit in this example) in m, the corresponding bit in any number in the equivalence class is identical to the corresponding bit in n.

Figure 2:
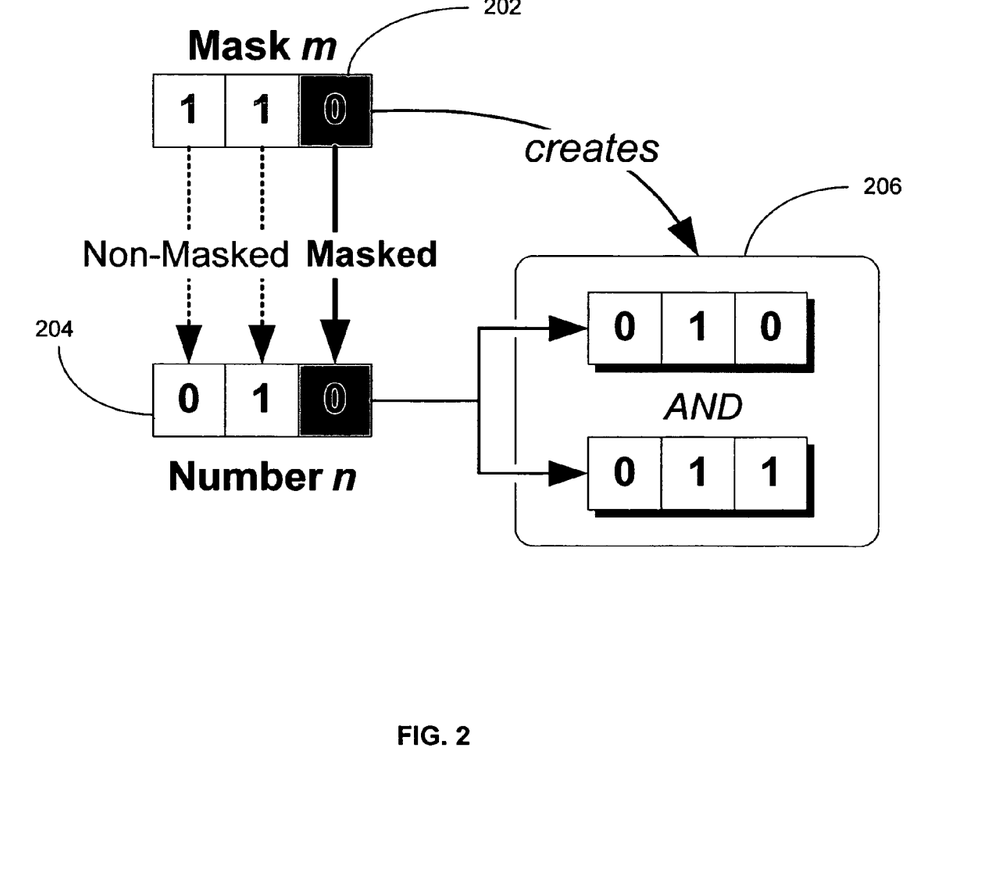
FIG. 2 illustrates an application of a mask to a masked number according to an embodiment of the present invention.

FIG. 2 illustrates an application of a mask to a masked number according to an embodiment of the present invention. Consider the tuple "010/110" (expressed in binary format instead of hexadecimal format for ease of exposition) in FIG. 2. A mask m 202 is applied to the number n 204 to create an equivalence class of version numbers 206.

Applying the definition of a mask given above, a number x, such that x is a member of EQC(010/110), has '1' and '0' in bit positions 2 and 3 respectively (counting the three bits from right, or least significant, to left, or most significant). This is because bit positions 2 and 3 in the mask "110" are 1s (i.e., not masked), which implies that in x, these two bits have the exact values of the corresponding bits in n. However, x can have either a '1' or a '0' in bit position 1, since the value of bit-1 in the mask "110" is '0' (i.e., masked). Thus, EQC(010/110) is the set {010, 011}, i.e., the set {2, 3}, and hence, x can be either 2 or 3.

In an open architecture test system, a commonly performed operation is to determine whether a hardware version number x provided by the user is a member of the masked equivalence class. One way to determine membership in a masked equivalence class is to show that the number x is a member of EQC(n/m) if and only if x & m=n, where "&" is the bitwise-AND operator. This property provides a convenient way of performing the required determination.

Next, a method for generating a system profile with a masked representation of the equivalence class of a large number of non-contiguous version numbers is described. In general, the method includes 1) processing the set of masked hardware versions; 2) providing the user with a choice of compatible software component versions to run the user's chosen version of the vendor hardware module; and 3) computing the compact representation of the set of hardware versions for each vendor hardware module that results from the user's selection of compatible software component versions for the modules; and 4) storing the compact representation in the user's system profile.

For processing the set of masked hardware versions, the notation used for representing the versions of vendor hardware modules and their associated software components is described as follows. First, let a particular vendor hardware module be denoted as M, and let the software components that are required for controlling the hardware module M in the ATE be denoted by the set {MX}, where X can be A, B, C, . . . etc. Thus, for example, if M has a total of four software components, they are represented as MA, MB, MC and MD. Next, let a particular version k of a software component X for the vendor hardware module M be denoted as MX.k. For example, version 1 of the component A for module M is denoted as MA.1. Moreover, the set of hardware versions supported by the $k^{th}$ version of the software component X for the vendor hardware module M is denoted as HWR(MX.k). For example, HWR(MA.1) represents the set {3, 5, 010/011}. Note that for simplicity, the masked numbers are represented in binary format. A person of ordinary skill in the art would recognize that the masked numbers may be represented in hexadecimal or other formats.

Figure 3:
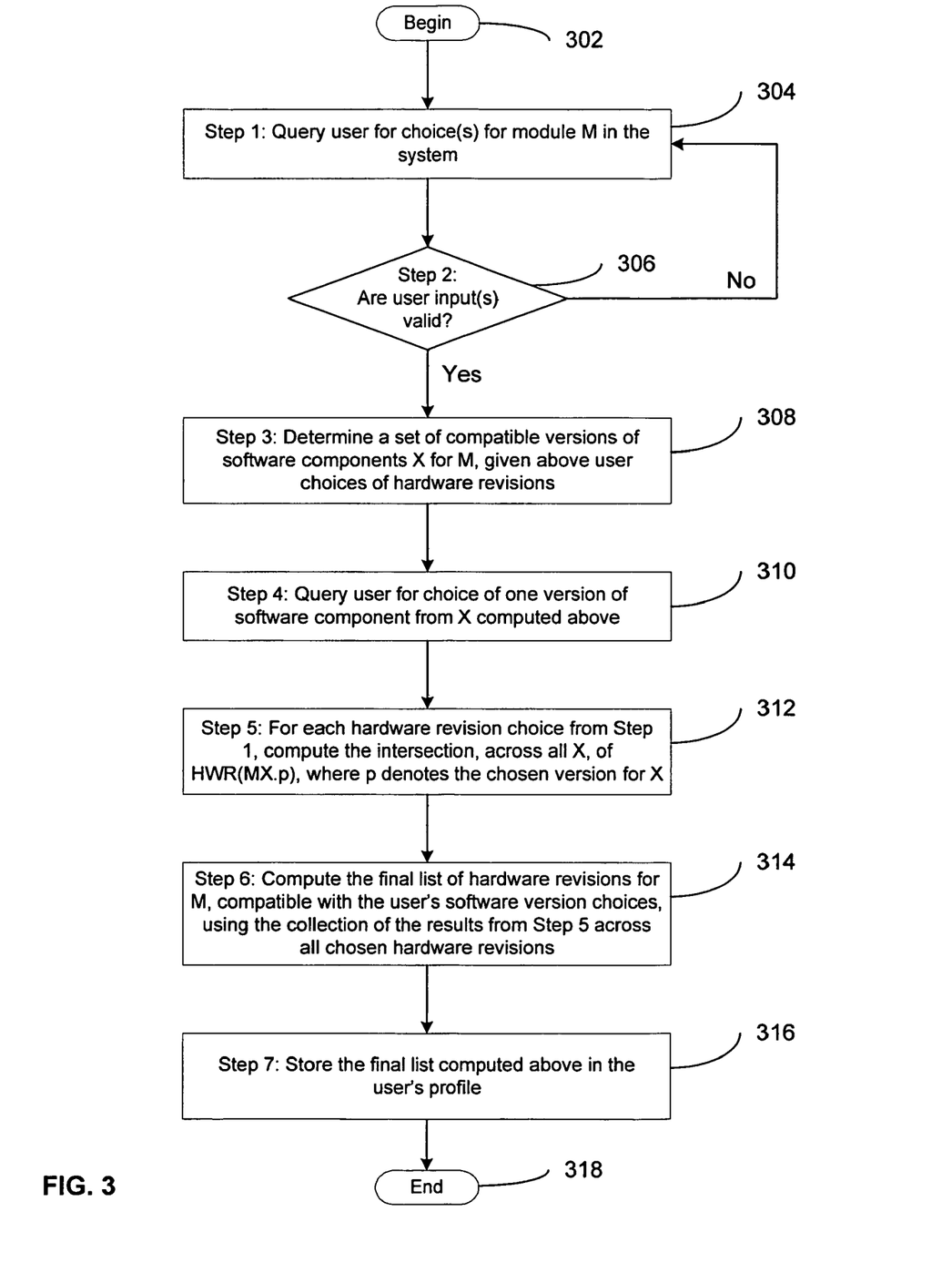
FIG. 3 illustrates a method for creating a system profile for testing different vendor hardware module versions in an open architecture test system according to an embodiment of the present invention.

FIG. 3 illustrates a method for creating a system profile for testing different vendor hardware module versions in an open architecture test system according to an embodiment of the present invention. The method starts in the Begin state (302) and thereafter moves to Step 1 (304) where the method queries the user for choice(s) of hardware version numbers for module M in the test system. As discussed above, the use of arbitrarily masked values for hardware versions and the resulting families of hardware version numbers, create a challenge in representing the equivalence class EQC(n/m) to the user. A complete enumeration (and subsequent maintenance) of all possible values x, such that x is a member of EQC(n/m), can be exponentially complex, especially in view of the number of masked bits specified in m. For even moderately large values of m (e.g. for m is less than or equal to 32), the method of complete enumeration is clearly inefficient and impractical. Hence, the user is prompted to enter his choice of hardware version value(s).

In Step 2 (306), the method determines whether each user entry is a valid choice. The determination is performed using the method described above in determining whether the hardware version number is a member of the EQC. If the user input(s) are valid (306_yes), the method continues to Step 3. If not (306_no), the method repeats Step 1 and queries the user to re-enter a hardware version number.

In Step 3 (308), upon a successful user entry of the hardware version number(s), the method determines a set of compatible versions of software components k of X compatible with HWR(MX.k) (the user's choices of hardware version(s) for M). In each step, the method discussed above for testing the hardware version number(s) against masked values is used. For each of the user's choices, if it is covered by a masked value, the entire equivalence class corresponding to that masked value is deemed to have been chosen. This property is important for achieving effective compact representation of the hardware version numbers.

In Step 4 (310), the method queries the user for a choice of one version of software component from the set of compatible software components determined above.

In Step 5 (312), the method computes the intersection, across all X, of HWR(MX.p), where p denotes the chosen version of software component from X, for each hardware version choice from Step 1. A detailed discussion of computation of intersections is given below in association with the discussion of FIG. 4. This step evaluates the overall list of all compatible hardware versions by computing the intersection of all the sets HWR(MX.p), for each user-chosen version p of the software component X. This step repeats this computation for each of the user's hardware version choices (with each user choice resulting in a single value or single EQC), and collects the results.

In step 6 (314), the method computes the final list of hardware versions for M, which are compatible with the user's software version choices, using the collection of the results from Step 5 across all chosen hardware versions.

In Step 7 (316), the method stores the final list computed above in the user's profile. The method ends in the End state (318).

Figure 4:
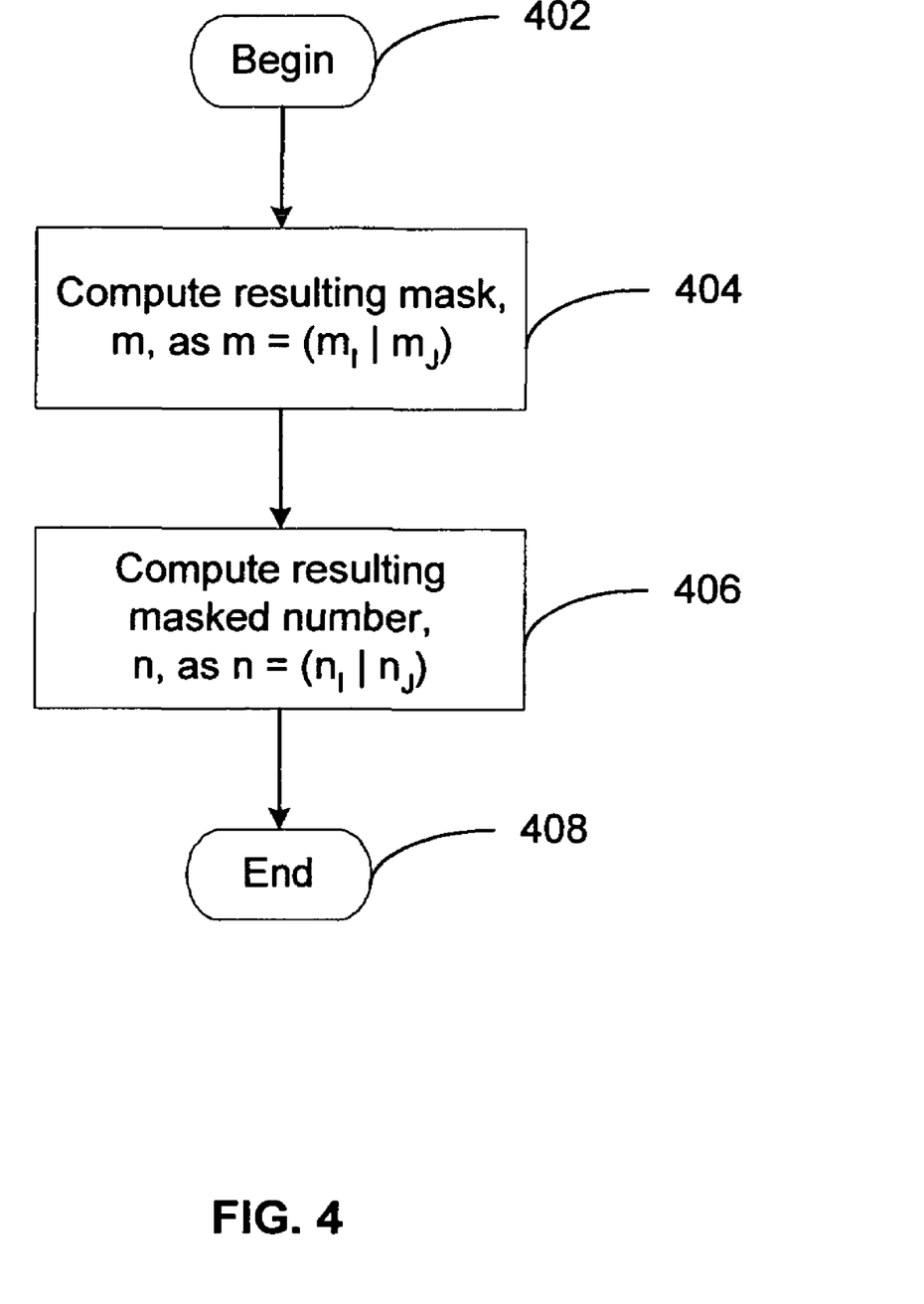
FIG. 4 illustrates a method for computing intersections of masked representations according to an embodiment of the present invention.

FIG. 4 illustrates a method for computing intersections of masked representations according to an embodiment of the present invention. As shown in FIG. 4, the intersection of two components, $m_I$ and $m_J$, assuming that each choice is a masked one (i.e., an entire equivalence class), is computed. A person of ordinary skill in the art would recognize that it is possible to extend the method for computing intersections to non-masked vs. masked or non-masked vs. non-masked choices of hardware version numbers. As shown in FIG. 4, the user choice for $m_I$ is represented by EQC($n_I/m_I$), and the user choice for $m_J$ is represented by EQC($n_J/m_J$). Let the result of the intersection be EQC(n/m).

The method starts in the Begin state (402), and thereafter moves to Step 1 (404), where the method computes the resulting mask. The symbol "|" represents a bitwise-OR operation. The result of a bitwise-OR of $m_I$ and $m_J$ is indeed the resulting mask, since it is, by definition of the bitwise-OR operation and the definition of masks, the only mask that is satisfied by both $m_I$ and $m_J$. Note that if m is empty (i.e., all-1s), then EQC(n/m) consists of a single value n. In Step 2 (406), the method computes the resulting masked number, n. The method ends in the End state (408). A person of ordinary skill in the art would recognize that to extend the above computation of intersections to more than two components, one may use the values of n and m computed in Step 2 as the starting values for the next iteration in the computation, and so on.

The following example applies the methods described in FIGS. 3 and 4 above. Assume that a particular vendor hardware module M has three software components: component MA, component MB and component MC. Also assume that the set of choices a particular user has for available software versions of these components, and their corresponding supported hardware versions, is given in Table 1, where the notation "MX.n" signifies the $n^{th}$ version of the software component MX. For ease of exposition, the masked numbers are represented in binary instead of hexadecimal. In addition, it is assumed that the set of all possible hardware versions can be represented by three bits.

TABLE 1

| SW Component for Module M | Hardware Versions Supported by SW Component |
| --- | --- |
| MA.1 | 3, 5, 010/011 |
| MA.2 | 5, 000/100 |
| MA.3 | 000/110 |
| MB.1 | 010/010, 5 |
| MB.2 | 000/000 |
| MC.1 | 5, 010/110 |

Note that the ultimate goal is to allow the user to choose exactly one version of each software component available (i.e., one version each of MA, MB and MC) for working with the choice of hardware version(s) for the module M.
Applying the method of FIG. 3 to the above example:
1. The user choices are tested against the entire set MX.n, i.e., {3, 5, 010/011, 000/100, 000/110, 010/010, 000/000, 010/110}

Suppose the user chooses the hardware versions '2' and '5' for M. This results in the following associations:
 a. For hardware version '2', the associations are (i.e., the sets HWR(MX.n)$_2$ are):
  MA.1⇔010/011
  MA.2⇔000/100
  MA.3⇔∅ ('2' is not supported by MA.3)
  MB.1⇔010/010
  MB.2⇔000/000
  MC.1⇔010/110
 b. For hardware version '5', the associations are (i.e., the sets HWR(MX.n)$_5$ are):
  MA.1⇔5
  MA.2⇔5
  MA.3⇔∅ ('5' is not supported by MA.3)
  MB.1⇔5
  MB.2⇔000/000
  MC.1⇔5
2. The above associations dictate that the available software component choices for the user are
 one of {MA.1, MA.2},
 one of {MB.1, MB.2}, and
 one of {MC.1}.
3. Suppose the user (selecting one from each component group in 2 above) chooses the following: MA.2, MB.2 and MC.1. Then,
 a. For hardware version choice '2', the list of supported hardware versions is given by the intersection of the sets HWR(MA.2)$_2$, HWR(MB.2)$_2$ and HWR(MC.1)$_2$ according to the following steps:
  i. compute the intersection of HWR(MA.2)$_2$ with HWR(MB.2)$_2$, using the method of FIG. 4 as follows: 000/100∩000/000⇒000/100. (Where 000 & 100=000, and 000 & 000=000.)
  ii. compute the intersection of 000/100 with HWR(MC.1)$_2$: 000/100∩010/110⇒010/110. (Where 010 & 100=000, and 010 & 110=010.)
  iii. thus, the final equivalence class for the choice of hardware version '2' is 010/110, i.e., {2, 3}.
 b. For hardware version choice '5', the list of supported hardware versions is given by the intersection of the sets HWR(MA.2)$_5$, HWR(MB.2)$_5$ and HW(MC.1)$_5$:
  i. First, compute the intersection of HWR(MA.2)$_5$ with HWR(MB.2)$_5$, using the method of FIG. 3 as follows: 5∩000/000⇒101/111∩000/000⇒101/111.
  ii. Then, compute the intersection of 101/111 with HWR(MC.1)$_5$: 101/111∩5⇒101/111∩101/111⇒101/111 ⇒5.
  iii. Thus, the final value for the choice of hardware version '5' is 5.
4. From 3a and 3b above, applying Step 6 in FIG. 3, the list of supported hardware versions to be included in the user's profile for its choice of software components MA.2, MB.2 and MC.1 is therefore {010/110, 5}, i.e., {2, 3, 5}.

Therefore, a hardware module vendor can specify an arbitrary sequence of hardware version numbers that are guaranteed to work with a given version of the associated module software in an open architecture test system. In addition, the hardware version numbers are processed so as to provide the user with an optimal set of software component choices for the vendor hardware module, which leads to a valid system configuration for deployment in the field.

The present invention provides at least the following benefits. First, a compact representation of the supported module hardware versions is employed, representing an entire family of supported actual product versions for the vendor hardware module. Second, the disclosed method allows the vendor to publish a hardware version specification for a compatible software component that simultaneously supports all the hardware versions implicitly indicated by the specified value. Third, an arbitrary bit pattern can be specified by the vendor, so that the vendor is not restricted to choosing just contiguous version numbers. Fourth, the vendor-specified value can be treated by the open architecture test system software as a compact collection of all the individual hardware version numbers that make up the set. Fifth, the disclosed method efficiently analyzes the multiple compatible hardware version lists for the numerous software modules that are associated with the user's chosen vendor hardware modules, and presents the user with an optimal set of compatible software components to choose from while guaranteeing correct system operation. Finally, the disclosed method computes and stores, in the user's system profile, the optimally compact representation of the entire family of equivalent hardware versions for each chosen module. Thus, replacing a vendor hardware module with another from the same family requires neither a re-release of the hardware version list, nor a re-generation of the system profile.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form including hardware, software, firmware or any combination of these. The invention may optionally be implemented partly as computer software running on one or more data processors and/or digital signal processors. The elements and components of an embodiment of the invention may be physically, functionally, and logically implemented in any suitable way. Indeed the functionality may be implemented in a single unit, in a plurality of units or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A method, executed by a computer, for associating software components with vendor hardware module versions in an open architecture test system, wherein the open architecture test system comprises a System Controller, one or more Site Controllers, one or more vendor hardware modules, and one or more devices-under-test (DUTs), comprising:
    receiving a set of hardware versions of a vendor hardware module;
    processing the set of hardware versions of the vendor hardware module, wherein a mask value representing an equivalence class of hardware version numbers is generated based on the set of hardware versions of the vendor hardware module, wherein the mask value comprises a mask and a masked number, wherein the mask is a data pattern within the range of the set of hardware versions of the vendor hardware module, and wherein the data pattern comprises at least a don't-care bit and an unmasked bit;
    obtaining user choices of hardware versions of the vendor hardware module;
    validating the user choices of hardware versions of the vendor hardware module;
    creating a system profile in accordance with the user choices of hardware versions of the vendor hardware module;
    receiving a new hardware version of the vendor hardware module, wherein the new hardware version of the vendor hardware module is a member of the equivalence class of hardware version numbers; and
    testing the new hardware version of the vendor hardware module using the system profile.

2. The method of claim 1, wherein processing the set of hardware versions of the vendor hardware module comprises:
    specifying the equivalence class of hardware version numbers in accordance with the mask and the masked number.

3. The method of claim 2, wherein specifying the equivalence class of hardware version numbers comprises:
    for each don't-care bit in the mask, masking the corresponding bit in the masked number, thereby indicating that all members of the equivalence class of hardware version numbers have either a 1 or 0 in the corresponding bit position; and
    for each unmasked bit in the mask, using the corresponding bit in the masked number in the equivalence class of hardware version numbers, thereby indicating that the corresponding bit in the masked number is not masked.

4. The method of claim 2, wherein validating the user choices of hardware versions of the vendor hardware module comprises:
    if a user choice is covered by the mask value, identifying an entire equivalence class of hardware version numbers corresponding to the mask value as being chosen.

5. The method of claim 4, wherein validating the user choices of hardware versions of the vendor hardware module comprises:
    for each user choice of hardware version of the vendor hardware module, representing the user choice of hardware version of the vendor hardware module as valid if and only if a bitwise-AND of the user choice of hardware version of the vendor hardware module and the mask equals to the masked number.

6. The method of claim 1, wherein creating a system profile comprises:
    receiving a set of software components supported by the vendor hardware module;
    determining a set of compatible software components in accordance with the user choices of hardware versions of the vendor hardware module and the received set of software components;
    selecting a version of software component for each user choice of hardware version of the vendor hardware module;
    creating a list of user selected software components for each user choice of hardware version of the vendor hardware module; and
    storing the list of user selected software components.

7. The method of claim 6, wherein the set of software components comprises:
    one or more vendor software development kits;
    one or more user software development kits; and
    one or more vendor driver software versions corresponding to the set of hardware versions of the vendor hardware module.

8. The method of claim 6, wherein selecting a version of software component comprises:
    querying a user to choose a version of software component from the set of compatible software components; and
    for each user choice of the version of software component, computing an intersection, across the user choices of hardware versions of the vendor hardware module, for generating a list of supported hardware versions.

9. The method of claim 8, wherein computing an intersection comprises:
    computing resulting mask using the user choices of hardware versions of the vendor hardware module; and
    computing resulting masked number using the user choices of hardware versions of the vendor hardware module.

10. An open architecture test system, comprising:
    one or more computers implementing:
    a System Controller;
    one or more Site Controllers coupled to the System Controller;

one or more vendor hardware modules coupled to a Site Controller;

one or more devices-under-test (DUTs) coupled to a vendor hardware module in parallel;

means for receiving a set of hardware versions of a vendor hardware module;

means for processing the set of hardware versions of the vendor hardware module, wherein a mask value representing an equivalence class of hardware version numbers is generated based on the set of hardware versions of the vendor hardware module, wherein the mask value comprises a mask and a masked number, wherein the mask is a data pattern within the range of the set of hardware versions of the vendor hardware module, and wherein the data pattern comprises at least a don't-care bit and an unmasked bit;

means for obtaining user choices of hardware versions of the vendor hardware module;

means for validating the user choices of hardware versions of the vendor hardware module;

means for creating a system profile in accordance with the user choices of hardware versions of the vendor hardware module;

means for receiving a new hardware version of the vendor hardware module, wherein the new hardware version of the vendor hardware module is a member of the equivalence class of hardware version numbers; and means for testing the new hardware version of the vendor hardware module using the system profile.

11. The open architecture test system of claim 10, wherein the means for processing the set of hardware versions of the vendor hardware module comprises:

means for specifying the equivalence class of hardware version numbers in accordance with the mask and the masked number.

12. The open architecture test system of claim 11, wherein the means for specifying the equivalence class of hardware version numbers comprises:

for each don't-care bit in the mask, means for masking the corresponding bit in the masked number, thereby indicating that all members of the equivalence class of hardware version numbers have either a 1 or 0 in the corresponding bit position; and for each unmasked bit in the mask, means for using the corresponding bit in the masked number in the equivalence class of hardware version numbers, thereby indicating that the corresponding bit in the masked number is not masked.

13. The open architecture test system of claim 11, wherein the means for validating the user choices of hardware versions of the vendor hardware module comprises:

if a user choice is covered by the mask value, means for identifying an entire equivalence class of hardware version numbers corresponding to the mask value as being chosen.

14. The open architecture test system of claim 13, wherein the means for validating the user choices of hardware versions of the vendor hardware module comprises:

for each user choice of hardware version of the vendor hardware module, means for representing the user choice of hardware version of the vendor hardware module as valid if and only if a bitwise-AND of the user choice of hardware version of the vendor hardware module and the mask equals to the masked number.

15. The open architecture test system of claim 10, wherein the means for creating a system profile comprises:

means for receiving a set of software components supported by the vendor hardware module;

means for determining a set of compatible software components in accordance with the user choices of hardware versions of the vendor hardware module and the received set of software components;

means for selecting a version of software component for each user choice of hardware version of the vendor hardware module;

means for creating a list of user selected software components for each user choice of hardware version of the vendor hardware module; and means for storing the list of user selected software components.

16. The open architecture test system of claim 15, wherein the set of software components comprises:

one or more vendor software development kits;

one or more user software development kits; and one or more vendor driver software versions corresponding to the set of hardware versions of the vendor hardware module.

17. The open architecture test system of claim 15, wherein the means for selecting a version of software component comprises:

means for querying a user to choose a version of software component from the set of compatible software components; and for each user choice of the version of software component, means for computing an intersection, across the user choices of hardware versions of the vendor hardware module, for generating a list of supported hardware versions.

18. The open architecture test system of claim 17, wherein the means for computing an intersection comprises:

means for computing resulting mask using the user choices of hardware versions of the vendor hardware module; and means for computing resulting masked number using the user choices of hardware versions of the vendor hardware module.

19. A method, executed by a computer, for representing vendor hardware module versions in an open architecture test system, wherein the open architecture test system comprises a System Controller, one or more Site Controllers, one or more vendor hardware modules, and one or more devices-under-test (DUTs), comprising:

receiving a set of hardware versions of a vendor hardware module;

processing the set of hardware versions of the vendor hardware module, wherein a mask value representing an equivalence class of hardware version numbers is generated based on the set of hardware versions of the vendor hardware module, wherein the mask value comprises a mask and a masked number, wherein the mask is a data pattern within the range of the set of hardware versions of the vendor hardware module, and wherein the data pattern comprises at least a don't-care bit and an unmasked bit;

obtaining user choices of hardware versions of the vendor hardware module;

validating the user choices of hardware versions of the vendor hardware module;

receiving a new hardware version of the vendor hardware module, wherein the new hardware version of the vendor hardware module is a member of the equivalence class of hardware version numbers; and testing the new hardware version of the vendor hardware module using the equivalence class of hardware version numbers.

20. The method of claim 19, wherein a mask value representing an equivalence class of hardware version numbers comprises:
for each don't-care bit in the mask, masking the corresponding bit in the masked number, thereby indicating that all members of the equivalence class of hardware version numbers have either a 1 or 0 in the corresponding bit position; and
for each unmasked bit in the mask, using the corresponding bit in the masked number in the equivalence class of hardware version numbers, thereby indicating that the corresponding bit in the masked number is not masked.

21. The method of claim 19, wherein validating the user choices of hardware versions of the vendor hardware module comprises:
for each user choice of hardware version of the vendor hardware module, representing the user choice of hardware version of the vendor hardware module as valid if and only if a bitwise-AND of the user choice of hardware version of the vendor hardware module and the mask equals to the masked number; and
if a user choice is determined to be valid, identifying an entire equivalence class of hardware version numbers corresponding to the mask value as being chosen.

* * * * *